United States Patent
Hathaway et al.

(10) Patent No.: US 7,010,763 B2
(45) Date of Patent: Mar. 7, 2006

(54) METHOD OF OPTIMIZING AND ANALYZING SELECTED PORTIONS OF A DIGITAL INTEGRATED CIRCUIT

(75) Inventors: David J. Hathaway, Underhill Center, VT (US); Lawrence Kenneth Lange, Wappingers Falls, NY (US); Chandramouli Visweswariah, Croton-on-Hudson, NY (US); Patrick M. Williams, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 233 days.

(21) Appl. No.: 10/436,213

(22) Filed: May 12, 2003

(65) Prior Publication Data

US 2004/0230921 A1 Nov. 18, 2004

(51) Int. Cl.
*G06F 17/50* (2006.01)

(52) U.S. Cl. ................................. 716/2; 716/1; 716/18

(58) Field of Classification Search .................... 716/2, 716/6, 1, 18; 326/83
See application file for complete search history.

(56) References Cited

U.S. PATENT DOCUMENTS

| 5,798,658 A | * | 8/1998 | Werking | 326/83 |
| 6,430,731 B1 | * | 8/2002 | Lee et al. | 716/6 |
| 6,721,924 B1 | * | 4/2004 | Patra et al. | 716/2 |

* cited by examiner

*Primary Examiner*—Thuan Do
(74) *Attorney, Agent, or Firm*—Lynn L. Augspurger

(57) ABSTRACT

Disclosed is a method for achieving timing closure in the design of a digital integrated circuit or system by selecting portions of the circuit or system to be optimized and portions of the circuit or system in which the effects of such optimization are to be analyzed during the optimization process. Optimized portions will include gates whose design parameters are to be changed, a first analyzed portion includes gates whose delays and edge slews are to be recomputed, and a second analyzed portion includes gates whose ATs and RATs are to be recomputed during optimization. Constraints are imposed at selected boundaries between these portions to prevent unwanted propagation of timing information and to ensure the validity of timing values used during optimization. Through this selection, the size of the problem posed to the underlying optimization method will be reduced, allowing larger circuits or systems to be optimized and allowing optimization to be performed more quickly.

1 Claim, 7 Drawing Sheets

| GATE | TRANSISTOR WIDTHS CHANGED? | LOAD CHANGED? | INPUT SLEW CHANGED? | EDGE DELAYS AND EDGE SLEWS CHANGED? | ATs CHANGED? | RATs CHANGED? | SLACK CHANGED? |
|---|---|---|---|---|---|---|---|
| 100 | YES | NO | YES | YES | YES | YES | YES |
| 130 | NO | YES | NO | YES | YES | YES | YES |
| 140 | NO | NO | NO | NO | NO | YES | YES |
| 150 | NO | NO | YES | YES | YES | NO | YES |
| 160 | NO | NO | YES | YES | YES | YES | YES |
| 170 | NO | NO | YES | YES | YES | NO | YES |
| 180 | NO | NO | NO | NO | NO | YES | YES |
| 190 | NO | NO | NO | NO | NO | YES | YES |
| 200 | NO | NO | NO | NO | NO | YES | YES |
| 210 | NO | NO | NO | NO | NO | YES | YES |
| 220 | NO | NO | NO | NO | NO | NO | NO |

FIG.2

METHOD OF OPTIMIZING AND ANALYZING SELECTED PORTIONS OF A DIGITAL INTEGRATED CIRCUIT

RELATED APPLICATIONS

D. J. Hathaway, C. Visweswariah, P. M. Williams, and J. Zhou, "Method of Achieving Timing Closure in Digital Integrated Circuits by Optimizing Individual Macros," filed May 12, 2003 as U.S. Ser. No. 10/435,824 (0079).

E. K. Cho, D. J. Hathaway, M. Hsu, L. K. Lange, G. A. Northrop, C. Visweswariah, C. Washburn, P. M. Williams, J. Zhou, "A Method for Tuning a Synthesized Random Logic Circuit Macros in a Continuous Design Space With Optimal Insertion of Multiple Threshold Voltage Devices," filed May 10, 2004, as U.S. Ser. No. 10/842,589 (0206).

FIELD OF THE INVENTION

This invention relates to the design, and automation thereof, of high-performance digital integrated circuits. The invention is particularly directed to the problem of designing a digital integrated circuit or system, or portion thereof, which satisfies performance and other requirements by optimizing and analyzing a subset of the component gates or other elements that constitute the circuit or system.

These co-pending applications and the present application are owned by one and the same assignee, International Business Machines Corporation of Armonk, N.Y.

The descriptions set forth in these co-pending applications are hereby incorporated into the present application by this reference.

Trademarks: IBM® is a registered trademark of International Business Machines Corporation, Armonk, N.Y., U.S.A. Other names may be registered trademarks or product names of International Business Machines Corporation or other companies.

BACKGROUND

Achieving timing closure of high-performance digital integrated circuits or systems implies obtaining sufficient timing performance from the circuit or system. This may mean, for example, being able to operate the clock fast enough to obtain the required performance, while guaranteeing functional correctness and limiting the total area occupied by or power consumed by the circuit or system. Methods for achieving timing closure typically include application of optimization techniques, including formal mathematical tuning of circuit parameters such as transistor widths or other heuristic optimization methods. Such methods either sequentially or simultaneously adjust a number of circuit parameters, such as transistor widths, in order to meet specific timing requirements or to minimize the clock period at which the circuit or system will operate, subject to a variety of constraints.

Changes made in one portion of a circuit or system will affect timing results in different portions of the circuit or system, and these effects must be considered in evaluating circuit changes. In one method of static timing analysis which is used to determine the minimum clock period at which a circuit or system can operate, the circuit or system is divided into circuit elements, which may be primitive logic gates, or collections of transistors which are to be treated as a single logical circuit element (i.e., channel-connected components, which are collections of transistors connected to each other through their sources and drains), and delays are computed between the inputs and outputs of each circuit element. Circuit element may also comprise larger subsystems for which abstracted or estimated delay models have been created. Hereafter the term gate will be understood to include collections of transistors which are to be treated as a single logical circuit element, and larger subsystems for which delay models have been created. Each such input to output connection for which a delay is computed is called a delay edge, and the graph of all signal nets and all delay edges between them is called the timing graph of the circuit or system. Often additional delay edges associated with signal nets are included in the timing graph to model wire or interconnect delay, and separate nodes are introduced at each gate input and output, but for simplicity these will be omitted here. It is understood that the methods described here are readily applied to these and other alternative timing graph formulations. Edge delays (delays of particular input-to-output transitions of a gate) are functions of many parameters, including the size of the transistors in the gate, the loading on the output of the gate, and the slew at the input of the gate. An edge slew, which is the time it takes for a signal propagated between the input and output connected by a delay edge to make a transition from 0 to 1 or from 1 to 0 (often measured as the time taken to go between 10% and 90% of the supply voltage), is also computed for each delay edge, with similar functional dependencies. The slew value at an input of a gate which is used to compute edge delays and edge slews from that input is derived from the edge slews of all edges feeding the gate input. In one common timing analysis method the slew value is the maximum of these edge slew values. The loading value at the output of a gate which is used to compute delays and edge slews to that output is a function of the sizes of the transistors in the gates fed by that output. The computed edge delays are used to determine arrival times (ATs), required arrival times (RATs), and slacks throughout the circuit or system. Timing values may be early mode, computed to determine whether any signals will arrive too early at any memory element or primary output (e.g., before the data from the previous cycle has been stored), or late mode, to determine the longest path through the circuit or system, and hence the minimum clock period at which the circuit or system will operate. In late mode analysis, the slack of an edge is the maximum amount by which the delay of the edge may be increased and still allow the circuit or system to operate at the specified clock period, and the slack of a node is the maximum amount by which the delay of any one edge feeding or fed by the node may be increased and still allow the circuit or system to operate at the specified clock period. Thus a negative slack indicates that the circuit or system will not operate at the specified clock period. The AT, RAT, and slack of a node in late mode analysis are:

$$AT_i = Max_j(AT_j + d_{ji})$$

$$RAT_i = Min_k(RAT_k - d_{ik})$$

$$Slack_i = RAT_i - AT_i$$

where $d_{ji}$ are the delays of all edges whose sink is node i and $d_{ik}$ are the delays of all edges whose source is node i.

Because the delays associated with rising and falling transitions of a net are typically different and have different dependencies on underlying gate parameters, separate ATs, RATs, and node slews are often computed for rising and falling transitions on a node in a circuit or system, and separate edge delays and edge slews are often computed for each possible combination of transitions on the source and sink of the edge. Separate ATs, RATs, and node slews may also be computed on a node to prevent improper combination of timing information associated with different clock phases, to facilitate false path analysis, or for other purposes well known to those skilled in the art, with separate edge delays and slews computed between such partitions of node data. It will therefore be understood hereafter that a timing node may refer to a particular combination of associated timing information on an electrical node of the circuit or system (e.g., the AT, RAT, and node slew associated with a rising signal launched by a particular clock phase), and an edge may refer to information propagated between a particular pair of nodes in the above sense (e.g., the edge delay and edge slew associated with the propagation of a rising transition at the edge source to a falling transition at the edge sink).

Thus a change to the sizes of transistors in a gate will affect the edge slews and edge delays through the gate, and because of the dependence of node slew on edge slew, edge slew on node slew, edge delay on node slew, and AT on edge delay and AT, it will also affect the slews, edge slews, edge delays, and ATs of all nodes and edges in the fanout cone of the gate. Because of the dependence of edge delay and edge slew on load, changes to the sizes of transistors in a gate will also affect the edge delays and edge slews of input gates feeding the gate, and these will in turn affect the node slews, edge slews, edge delays, and ATs of all nodes and edges in the fanout cone of the input gates. And because of the dependence of RAT on edge delay and RAT, changes to the sizes of transistors in a gate will also affect the RATs of all gates in the fanin cone of any gate in the union of the fanout cones of the input gates of the gate. The slack values of a node are affected anywhere that either the AT or RAT values are affected. All of these effects are seen in circuit 90 of FIG. 1, where a change is assumed to have been made to transistors 110 and 120 of gate 100, directly affecting the edge delays and edge slews of gate 100. These changes also affect the loading of input gate 130, and hence the edge delays and edge slews of gate 130, but because the sizes of transistors in gate 130 are unchanged, the edge delays and edge slews of gate 140 are unchanged. Because the output slew of gate 130 has changed, the edge delays and edge slews of gates of gates 150, 160, and 170 are also changed, as are the ATs at these gate outputs. All of these delay changes cause the RATs of the output nodes of gates 100, 130, 140, 160, 180, 190, 200, and 210 to be affected (the outputs of gates 150 and 170 are primary outputs (POs) and hence their RATs are fixed). However because gate 220 is not in the fanin cone of any gate in the fanout cone of gate 130, neither its edge slews, edge delays, AT, or RAT are affected. These influences are summarized in FIG. 2.

Many of the optimization techniques used to achieve timing closure have practical limits on the size of the circuit or system to which they can be applied, due to memory, runtime, or numerical noise, and are therefore typically applied to small partitions of a circuit or system. Such application requires partitioning of the circuit or system and establishment of constraints or assertions at the boundaries of these partitions, effectively blocking the flow of timing information, as described above, between the partitions and allowing them to be optimized separately. An example of this can be seen in FIG. 3, in which circuit 90 of FIG. 1 has been divided into partitions 300 and 310. ATs, slews, and load limits have been asserted inputs 320 and 330 of partition 310, while required arrival times (RATs), loads, and slew limits have been asserted at outputs 340 and 350 of partition 300. These assertions are set in such a way that if each partitions is modified so that the timing requirements imposed by the partition assertions are met, the timing requirements imposed by the overall circuit timing assertions will also be met. For example, the AT assertion for an input of a partition would typically be set to be greater than or equal to the RAT assertion at the output of the partition which feeds it. Similarly, since edge delay is generally an increasing function of both input slew and output load, a partition input slew assertion would be set to be greater than or equal to the corresponding partition output slew limit, and a partition input load limit would be set to be less than or equal to the corresponding partition output load. In general, in a late mode optimization which minimizes the delay of a circuit or attempts to meet an upper bound constraint on the circuit delay, the constraint limiting the allowed variation of a parameter on a first side of the partition boundary must not allow that parameter to change in a way that would result in a greater delay in an edge on the second side of the boundary than results from the parameter assertion on the second side of the boundary. While the above discussion referred to late mode timing analysis, similar boundary constraints and assertions can be used to allow partitioned early mode analysis and optimization. In early mode, the AT assertion for an input of a partition would typically be set to be less than or equal to the RAT assertion at the output of the partition which feeds it, and a constraint limiting the allowed variation of a parameter on a first side of the partition boundary must not allow that parameter to change in a way that would result in a smaller delay in an edge on the second side of the boundary than results from the parameter assertion on the second side of the boundary.

Such partitioning can cause disruption to other steps in the design process. In addition, any partition boundary constraints determined before optimization of the circuit or system partitions are unable to account for the effects of the subsequent optimization, and will therefore result in unequal effort being applied to different portions of critical paths cut by these partition boundaries, and thus in a sub-optimal result.

Thus there is a need for a method which allows optimization techniques to apply to portions of a circuit or system without partitioning.

SUMMARY OF THE INVENTION

This invention relates to an improved method for achieving timing closure in the design of a digital integrated circuit or system by selecting portions of the circuit or system to be optimized and portions of the circuit or system in which the effects of such optimization are to be analyzed during the optimization process. A first optimized portion of the circuit or system will be identified containing those gates which will be modified, e.g., by having their transistor sizes changed. This first optimized portion will include timing critical portions of the circuit or system, i.e., those gates corresponding to nodes and edges in the timing graph which have a slack value below a first threshold, typically specified by the circuit designer, and which are therefore limiting the performance of the circuit or system. An optional second optimized portion of the circuit or system will include highly timing-noncritical portions of the circuit or system in which the slack is above a second threshold, because gates in these portions are likely to be able to be significantly reduced in size or power without limiting circuit or system performance, and hence the optimization may "steal" area or power from them, using it to speed up the critical portion of the circuit or system without violating overall area or power constraints. In addition to the portion of the circuit or system to be optimized or modified, other selected portions will be analyzed during optimization (i.e., will have certain timing values updated during the optimization process). A first analyzed portion of the circuit or system will include gates whose edge delays and edge slews are to be recomputed during optimization, so that the effects of load variation and slew variation on the edge slews and edge delays of this first analyzed portion will be considered. A second analyzed portion of the circuit or system will include portions of the circuit or system in which only the propagated affects of AT and optionally RAT changes on other AT and RAT values will be considered, and in which no edge slew or edge delay recomputation is needed during the optimization process. Slew constraints and assertions will be applied at the inputs of the second analyzed portion, to maintain the validity of the original edge slews and edge delays in the second analyzed portion, and thus avoid the need for their reevaluation during optimization. Load constraints and assertions will also be applied at any inputs of optimized portion gates which are fed directly by gates which have not been included in the first analyzed portion. An optimization method will then be applied, optimizing and analyzing only the identified optimized and analyzed portions of the circuit or system, respectively.

These and other improvements are set forth in the following detailed description. For a better understanding of the invention with advantages and features, please refer to the detailed description and to the drawings.

DESCRIPTION OF THE DRAWINGS

FIG. 2 is a table illustrating the affects on various timing values of a modification of the circuit of FIG. 1.

Our detailed description below explains the preferred embodiments of our invention, together with advantages and features, by way of example with reference to the drawings.

DETAILED DESCRIPTION OF THE INVENTION

The inventive method applies to the design of a digital integrated circuit or system which is to be optimized to operate at a specified clock period, to reduce the minimum clock period at which the circuit or system can operate, and optionally to reduce the portion of the circuit or system (e.g., the number of gates) which are in paths which limit the clock period at which the circuit or system will operate. It may equally apply to the design of a partition of a circuit or system.

The general goal of circuit or system optimization is to minimize some objective function subject to a set of constraints. The objective may include the clock period at which the circuit or system can operate, circuit or system area or power, or some combination of these and/or other objectives. Optimization constraints can include the clock period at which the circuit or system can operate, circuit or system area or power, slews, beta ratios of gates (the ratio between the "strength," or effective composite width of the pullup and pulldown networks of a CMOS gate), loading on primary inputs (PIs), noise margins, and other factors. The timing analysis performed during the optimization may be the method described above which computes delays, slews, ATs, RATs, and slacks, and may compute only a subset of these values. In particular, the timing analysis may propagate only AT values and not RAT values, since the final AT value propagated to a primary output may be used with a RAT value asserted at that primary output to determine the worst slack at any node within the fanin cone of the primary output. Alternatively, the timing analysis may use path-oriented methods which compute path delays instead of ATs, RATs, and slacks. The timing analysis may also make use of pruning methods such as those described by A. R. Conn et al. in U.S. Pat. No. 6,321,362. The optimization may be achieved by using formal mathematical optimization or heuristic optimization techniques. The method may be applied to any type of circuitry that is amenable to static timing analysis; although described here in terms of combinational logic for simplicity of explanation, it can easily be extended to situations with master-slave latches, transparent latches, multi-cycle clocks, multi-frequency clocks and dynamic circuits.

Figure 1:
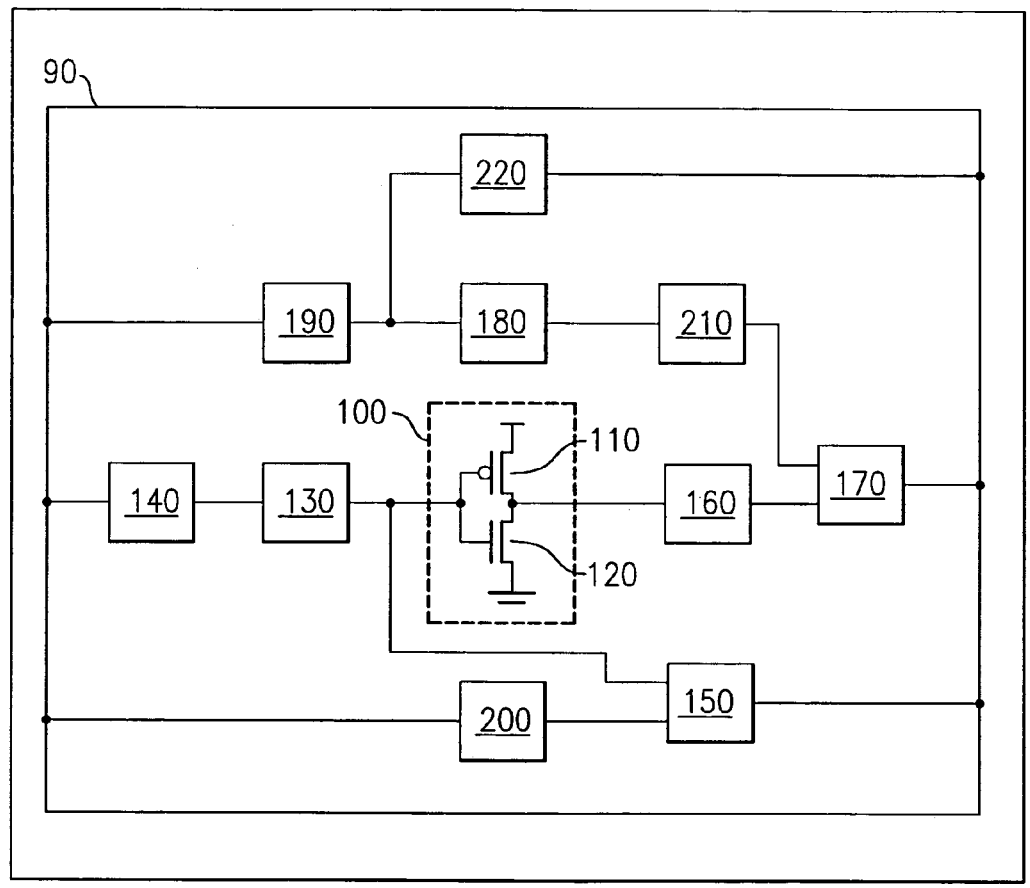
FIG. 1 illustrates a small typical circuit to which an optimization method would be applied.
Figure 3:
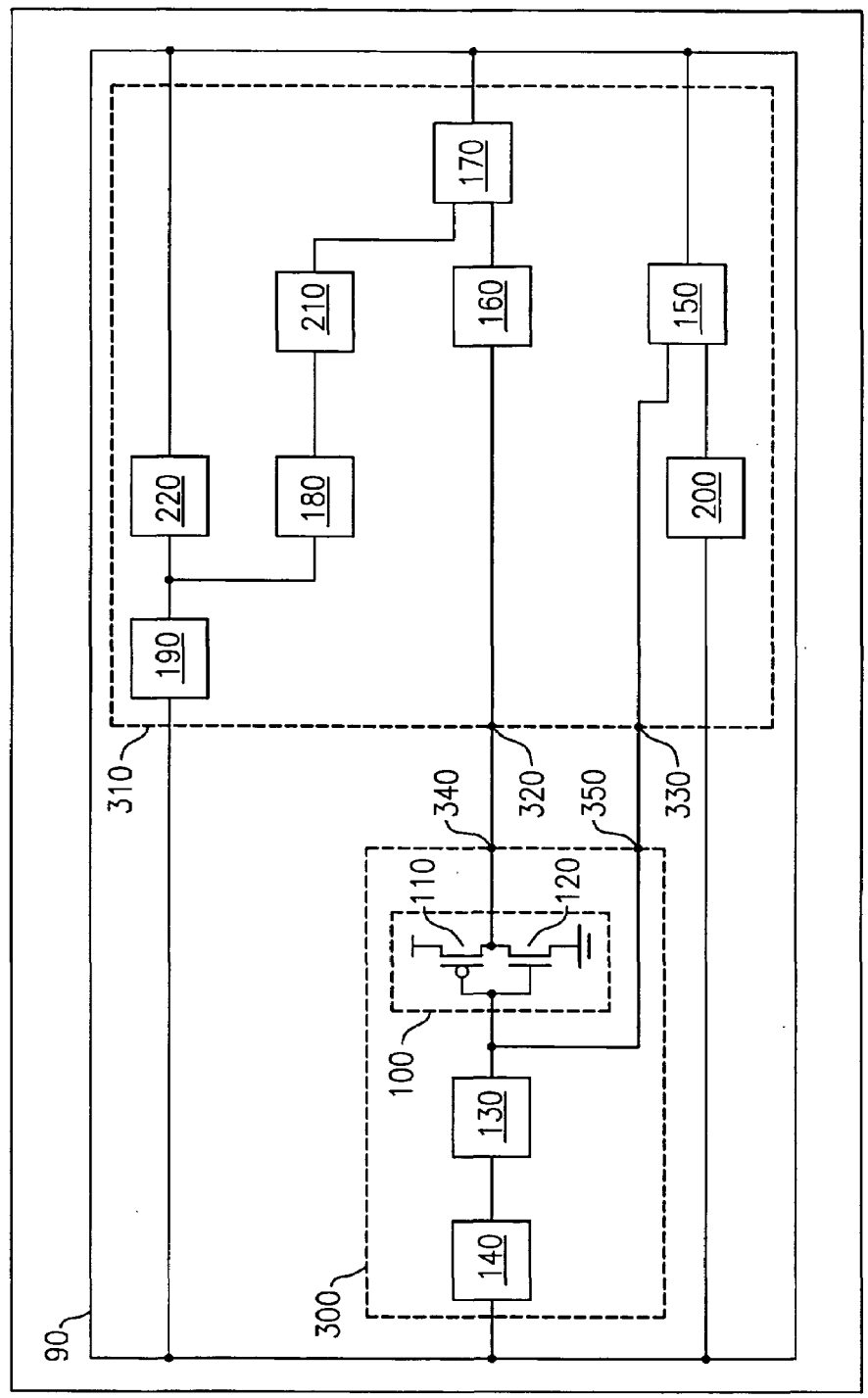
FIG. 3 illustrates a typical partitioning of the circuit of FIG. 1 according to prior art methods to reduce the size of the optimization problems to be solved.
Figure 4:
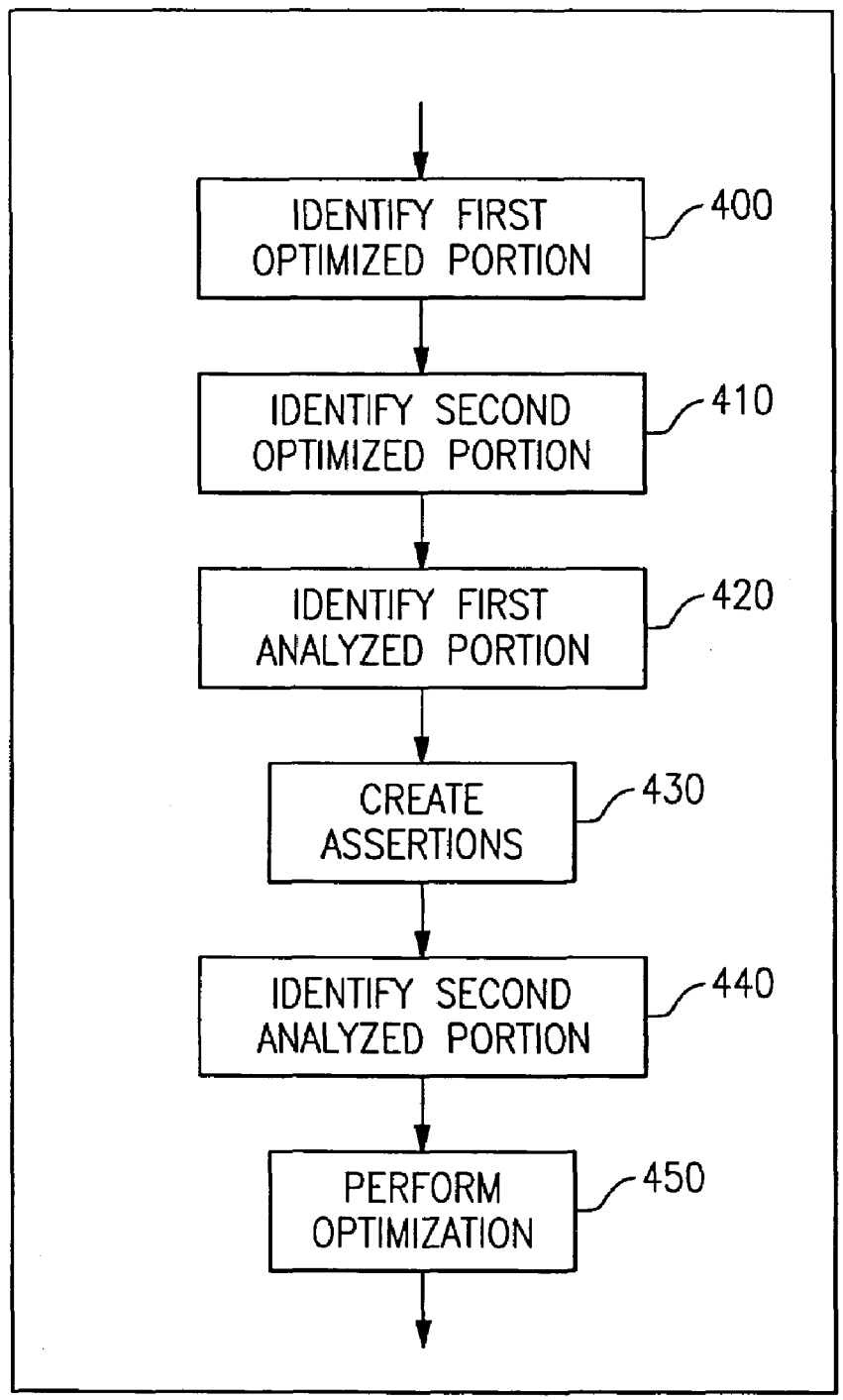
FIG. 4 is a flowchart illustrating the steps of the invention.
Figure 5:
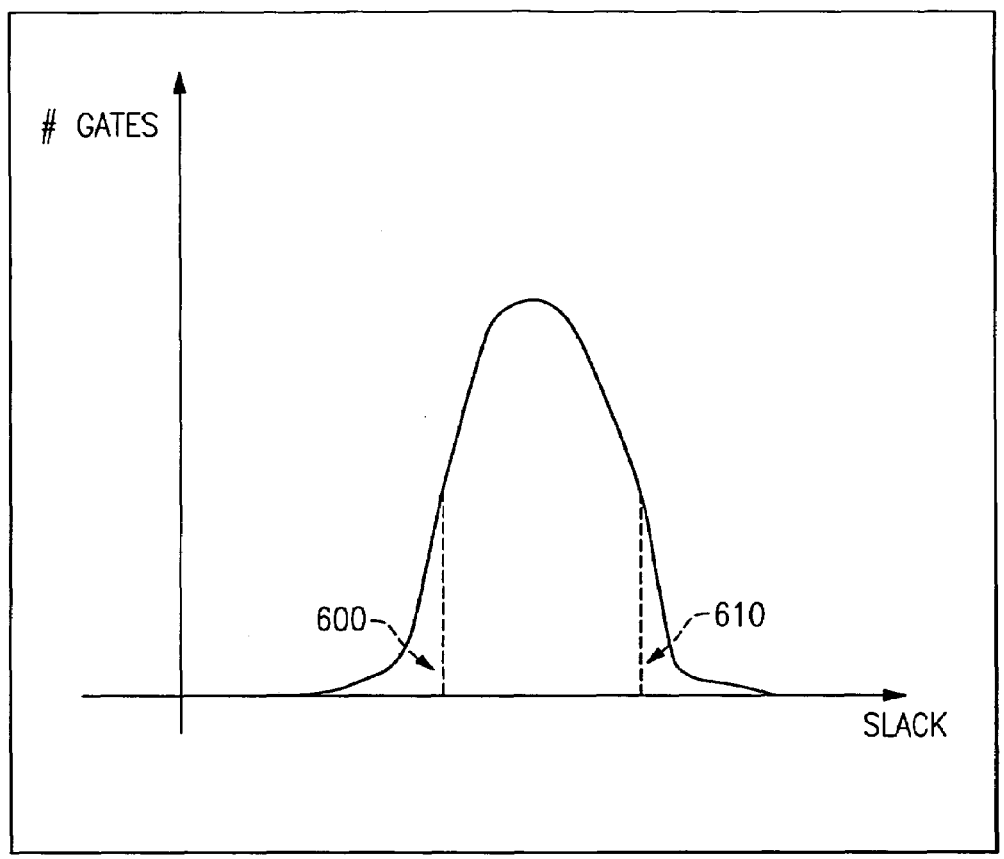
FIG. 5 illustrates a slack histogram indicating the timing-critical and timing-noncritical portions of a circuit which are to be optimized.

Referring now to FIG. 4, the inventive method begins with step 400 in which the critical portion of the circuit or system is identified as a first optimized portion of the circuit or system. This identification will typically be accomplished by performing an initial timing analysis on the unoptimized design and identifying gates any one of whose delay edges has a slack below some selected threshold. Typically this threshold might be zero, meaning that gates will be included through which pass at least one path which does not operate at the desired clock period. If the optimization objective is to minimize the clock period at which the circuit or system can operate, the threshold might instead be chosen such that a predetermined number or fraction of the gates in the circuit or design are selected, based on the capacity of the underlying optimization method to be applied. A slack histogram is shown in FIG. 5 in which the horizontal axis represents the slack of a gate, and the vertical axis represents the number of gates in the circuit or system with a particular slack value. Region 600 represents the set of gates with slacks below the selected threshold and which will therefore be included in the first optimized portion.

The first optimized portion of the circuit may optionally be expanded to include one or more levels of gates feeding the timing-critical gates whose slacks are below the selected threshold. One reason for such an expansion is that the changes made to a timing-critical gate during optimization (e.g., increases in transistor sizes) will often increase the load on the gates feeding the changed gate. If some constraint on a feeding gate (e.g., a maximum slew limit) is close to its limit, any increase in the load on the feeding gate may cause this limit to be exceeded, and thus to avoid violation of the constraint the optimizer would be unable to make desired changes in the timing-critical gate. Changes to the feeding gate made to relax this constraint and allow the desired changes in the timing-critical gate could in turn cause another gate feeding the feeding gate to exceed some constraint limit, and thus it may be advantageous to include more than one level of gates feeding the timing-critical portion in the first optimized portion. To limit the expansion of the first optimized portion (and hence reduce the complexity of the problem to be solved by the underlying optimization method), the feeding gates to be included in the first optimized portion may be restricted to those which have some load-dependent constraint which is close (e.g., within some specified range) of its limit. Because gates in a digital design typically perform a signal amplification in addition to their logical function, the change in the size of a gate required to accommodate a given increase in output load will typically cause a smaller change in the input load imposed by the gate on other gates feeding it. As a result, the benefit of including gates feeding the timing-critical portion in the first optimized portion will diminish with each additional level of feeding gate included, and typically only one or two levels would be included. A second reason for expanding the first optimized portion to include one or more levels of gates feeding the timing-critical gates is to allow the optimizer to improve all edge slews (whether timing critical or not) that converge on a critical node or feed a critical gate. For example, consider a critical gate that has one critical and one non-critical edge. If the gate feeding the non-critical edge is included in the optimization, the optimizer can improve the input slew of the non-critical edge which in turn will improve the edge slew of the non-critical edge. If the node slew at the output of the critical gate is, for example, determined as the maximum of all edge slews incident on it, then this node slew can now be improved without being limited by the edge slew of the non-critical edge. This node may in turn feed other downstream critical edges where the improved node slew is beneficial in obtaining improved edge and node slews. Because the derivative of edge slew with respect to input slew is typically positive but significantly less than one, the effect of slew changes tends to diminish with increasing levels of logic. For example, if a gate change causes a slew change of 100 ps and the derivative of edge slew with respect to input slew is 0.1, the slew change at the output of a gate fed directly by the changed gate would be of the order of 10 ps, and the slew change at the output of a gate fed in turn by this gate would be of the order of 1 ps. Thus, changes made beyond the first few levels of the gates feeding the timing-critical portion will have an attenuating and negligible effect on the slews and delays in the timing-critical portion.

The first optimized portion of the circuit may also optionally be expanded to include one or more levels of gates fed by the timing-critical gates whose slacks are below the selected threshold. One reason for this expansion is that the changes made to a timing-critical gate during optimization (e.g., decreases in transistor sizes) may decrease the slew at the output of the gate. If this slew is close to some maximum limit, or if some other constraint on the gate which is dependent on gate load is close to its limit, the optimizer may be prohibited from making a desired change in the gate, to avoid violating the constraint limit. If the optimizer is allowed to make changes to the gates fed by the changed timing-critical gate to reduce the load imposed on the timing-critical gate, it may enable the desired change to the timing-critical portion. Changes to a fed gate to reduce its input load may in turn cause it to violate its own load-dependent constraint, and thus it may be advantageous to include more than one level of gate fed by the timing-critical portion in the first optimized portion. Slew constraints are the most common load-dependent constraint, and because the derivative of edge slew with respect to input slew is typically positive but less than one, the effect of slew changes tends to diminish with the number of levels of logic. A second reason to expand the first optimized portion to include gates fed by the timing-critical gates is that reductions in load in these gates may also directly reduce the delays of the timing-critical gate which depend on that load, benefiting the optimization objective of reducing the clock period at which the circuit or system can operate.

The first optimized portion of the circuit can further optionally include gates of the circuit where other constraints such as beta ratio, slew, input loading or noise are violated, in order to give the optimizer a chance to satisfy such constraints. Again, these portions can be suitably locally expanded to give the optimizer a better chance of fixing these violated constraints.

Continuing with the flowchart of FIG. 4, in step 410 a noncritical portion of the design is optionally identified as a second optimized portion of the circuit or system. This selection will typically be accomplished by identifying gates or groups of channel-connected transistors whose delay edges have slacks computed in an initial timing analysis which are all above some selected threshold. This can be seen in portion 610 of the slack histogram of FIG. 5. Typically this threshold would be chosen so that the power, area, or other design resources consumed by the selected gates can be significantly reduced, allowing that resource to be applied to speeding up the critical portion. The number of gates selected would also typically be limited, so that the total size of the first and second optimized portions of the design do not exceed the capacity of the underlying optimization method to be applied. This second optimized portion could also be expanded to include one or more levels of gates feeding the timing-noncritical gates and one or more levels of gates fed by the timing-noncritical gates, but this would typically not be done, since changes in this portion are made to recover design resources, and changes are not required on any particular gate to minimize or meet a specific requirement for the clock period at which the circuit or system can operate.

Regardless of other selection criteria, it may be desirable to exclude from the optimized portions any gates whose modification would be undesirable. One example of such gates might be those in portions of the circuit or system for which physical layout (placement and wiring) has already been performed. It is also possible that modification of gates in the optimizd portions could be restricted to a subset of the gate parameters. For example, one might choose to allow modification of the sizes of only a subset of the transistors of a particular gate. This could be thought of as including partial gates in the optimized portion.

Again continuing with the flowchart of FIG. 4, in step 420 a first analyzed portion of the circuit or system is identified. The edge delays and edge slews of gates in this portion will be directly or indirectly affected by the design changes made in the optimized portions, and these affected values will be recomputed during the optimization process. The first analyzed portion obviously includes all the gates in the first and second optimized portions. Additionally, this first analyzed portion will typically include gates which feed the gates of the first optimized portion, because their edge delays and edge slews will depend on the load of these first optimized portion gates which could change during the optimization. If the gates feeding the first optimized portion gates were not reanalyzed during optimization, it would be necessary to prevent changes to the timing-critical gates which increase their input load (e.g., transistor size increases) from being made during optimization, as this would increase the delays of the feeding gates, and this increase would not be properly taken into consideration in the optimization process. Since effective optimization of the timing-critical gates may require changes in their parameters which could cause such delay increases in the feeding gates, these feeding gates must be included in the first analyzed portion. The inclusion of these feeding gates may be restricted to omit gates feeding other inputs of the gates added to the first optimized portion when it was expanded to include gates fed by the timing-critical gates. This is because changes to these gates fed by the timing-critical gates will typically only reduce their input capacitance, and would therefore only reduce the load and delays of the gates feeding them. Thus, ignoring these changes would cause the optimization to use delays and slacks which are potentially pessimistic (i.e., slacks which are smaller than the correct values or slews which are larger than the correct values), and the circuit or system would still operate correctly at the minimum clock period resulting from the timing analysis performed during the optimization process. The inclusion of these feeding gates may also be restricted to omit gates feeding gates added to the first optimized portion when it was expanded to include gates feeding the timing-critical gates, since this expansion already allowed the optimization process to account for effects of changed slews on levels of logic feeding the timing-critical gates, and thus little additional benefit is gained by analyzing additional feeding levels.

Gates which feed the timing-noncritical gates of the second optimized portion would typically not be included in the first analyzed portion, because the changes in the parameters in these timing-noncritical gates (e.g., reductions in transistor sizes) would typically only reduce the load and delays of the gates feeding them. Again, ignoring these changes would cause the optimization to use delays and slacks which are potentially pessimistic (i.e., slacks which are smaller than the correct values or slews which are larger than the correct values), and the circuit or system would still operate correctly at the minimum clock period resulting from the timing analysis performed during the optimization process.

The first analyzed portion may also include one or more levels of gates fed by the timing-noncritical gates of the second optimized portion, because changes made to these gates to reduce area, power, or other resources will typically increase their edge slews, and hence the input slew applied to the gates they feed and the delays of those gates. If the delays and edge slews of the gates fed by the timing-noncritical gates were not recomputed during optimization, it would be necessary to prevent slew-increasing changes from being made to the timing-noncritical gates during optimization, as this would increase the delays of the fed gates, and this increase would not be properly taken into consideration in the optimization process. Since effective recovery of area, power, and other resources from the timing-noncritical gates requires changes in their parameters which could cause increases in their slews, the gates they feed should be included in the first analyzed portion.

Gates which are fed by the timing-critical gates of the first optimized portion would also typically be included in the first analyzed portion, because the optimization of the circuit or system may require changes in the parameters in these timing-critical gates which could either increase or decrease their edge slews, and to allow for changes which may increase these slews, and hence the delays of the fed gates, the fed gates should also be included in the first analyzed portion. Because the derivative of edge slew with respect to input slew is typically positive but less than one, the effect of slew changes tends to diminish over several levels of logic. Thus, even though a change in gate parameters may have an effect on the slews of all gates in the fanout cone of the changed gate, most of these effects are seen within the first few levels of gates fed by the changed gate, and thus only these need to be included in the first analyzed portion. The inclusion of fed gates in the first analyzed portion may be restricted to omit gates fed by non-timing-critical gates added in the expansion of the first optimized portion to include gates feeding and fed by the timing-critical gates, for reasons similar to those cited above for limiting the inclusion of feeding gates in the first analyzed portion.

In determining which gates feeding and fed by the initial optimized portions to include in the optimized portion or in the first analyzed portion, other considerations beyond those described above related to slew and load may be used. Specifically, any means by which one can ascertain the degree to which the ability to optimize the initial optimized portions is enhanced by inclusion of other gates in the optimized portion or the first analyzed portion may be used in making this determination, and such methods will be understood to be included in the scope of this invention.

Returning to the flowchart of FIG. 4, in step 430 a slew constraint is placed at the output of any gate which is in the first analyzed portion of the circuit or system and which feeds at least one gate which is not in this portion, to place an upper bound on the slew which may occur at this node during optimization, and thus ensure that the assumption of constant delays and slews in the fanout cone of the node does not result in invalid optimization results. Typically this constraint will be the same as the slew produced in an initial timing analysis before the optimization. Alternatively, a different value might be used, but if this is larger than the value from the initial timing analysis, an additional timing analysis must be performed before beginning the optimization, to recompute the edge delays and edge slews in the fanout cone of the node, using the slew constraint value at the node, so that the delays in this fanout cone used during optimization will be a valid upper bound on the actual delays. A loading constraint is also placed at the input of any gate which is in the optimized portions of the circuit or system and which is fed by a gate not in the first analyzed portions of the circuit or system, to place an upper bound on the load which may occur at this point during optimization. Typically this constraint will be the same as the load imposed by the gate before optimization. Alternatively, a different value might be used, but if this is larger than the value from the initial timing analysis, an additional timing analysis must be performed before beginning the optimization, to recompute the edge delays and edge slews of the gates feeding the loading-constrained node, using the loading constraint value at the node instead of the actual gate load, so that the edge delays of these feeding gates used during optimization will be a valid upper bound on the actual edge delays.

Still continuing with the flowchart of FIG. 4, in step 440 a second analyzed portion of the circuit or system is identified. The edge delays and edge slews of gates in this portion will be treated as constants and will not be recomputed during the optimization process. This simplifies the optimization process, since the computation of additional edge delays and edge slews during optimization (by means of simulation or evaluation of delay models) and the handling of their variability by the optimization process would significantly increase the runtime and memory required by the optimization process, limiting the size of problem which can be handled. The second analyzed portion will include gates which are in the fanout cone of some gate in the first analyzed portion. It will also include gates which are in the fanin cone of some gate in the first analyzed portion. Gates in a fanout cone may have their input and output AT values change because of the delay changes of the gate in whose fanout cone they appear, and gates in a fanin cone may have their output and input RAT values change because of the delay changes of the gate in whose fanin cone they appear. Thus the gates in the second analyzed portion may have a changed slack due to either AT changes or RAT changes or both. These three situations are analyzed separately below.

The first situation is for gates in the second analyzed portion that appear only in a fanout cone of the first analyzed portion. Such gates need not be included, since their RAT values are unchanged during optimization, and due to the well-known properties of static timing analysis, the worst slack within the fanout cone which is affected by AT changes propagated from the root of the fanout cone will also be seen at the sink of the delay edge whose delay is changed (i.e., the root of the fanout cone). Thus, the outputs of gates with changed delays but which have no other gates or timing graph edges with changed delays in their fanout cone may be treated like primary outputs.

The second situation is for gates in the second analyzed portion that appear only in a fanin cone of the first analyzed portion. These gates need not be included, since their AT values are unchanged during optimization, and again due to the well-known properties of static timing analysis, the worst slack within the fanin cone which is affected by RAT changes propagated backwards from the root of the fanin cone will also be seen at the source of the delay edge whose delay is changed (i.e., the root of the fanin cone). Thus, the inputs of gates with changed delays but which have no other gates or timing graph edges with changed delays in their fanin cone may be treated like primary inputs.

The third situation is for gates in the intersection of the fanin and fanout cones of the first analyzed portion. Such gates must have both their AT and (if used) RAT values recomputed during the optimization. If this is not done, the AT values of the output of any gate at the output of the intersection region (i.e., the origin of the fanin cone) may become incorrect and the slack and predicted minimum operable clock period of any primary output fed by this gate may be incorrect. Similarly, if RAT values are used in the timing analysis, the RAT values of the input of any gate at the input of the intersection region (i.e., the origin of the fanout cone) may become incorrect, and the slack and predicted minimum operable clock period of any primary input feeding this gate may be incorrect. To avoid these errors, any fanin and fanout cone intersection for which ATs and RATs were not recomputed would have to assume constant ATs and RATs and to impose AT and RAT constraints on the origins of the fanin and fanout cones, respectively, which could reduce the opportunities for the optimizer to make tradeoffs in delay across these cone intersections. Thus the ATs and (if used) RATs of the second analyzed portion are preferably updated during the optimization, even though the edge slew and edge delays of this portion are not recomputed.

Figure 6:
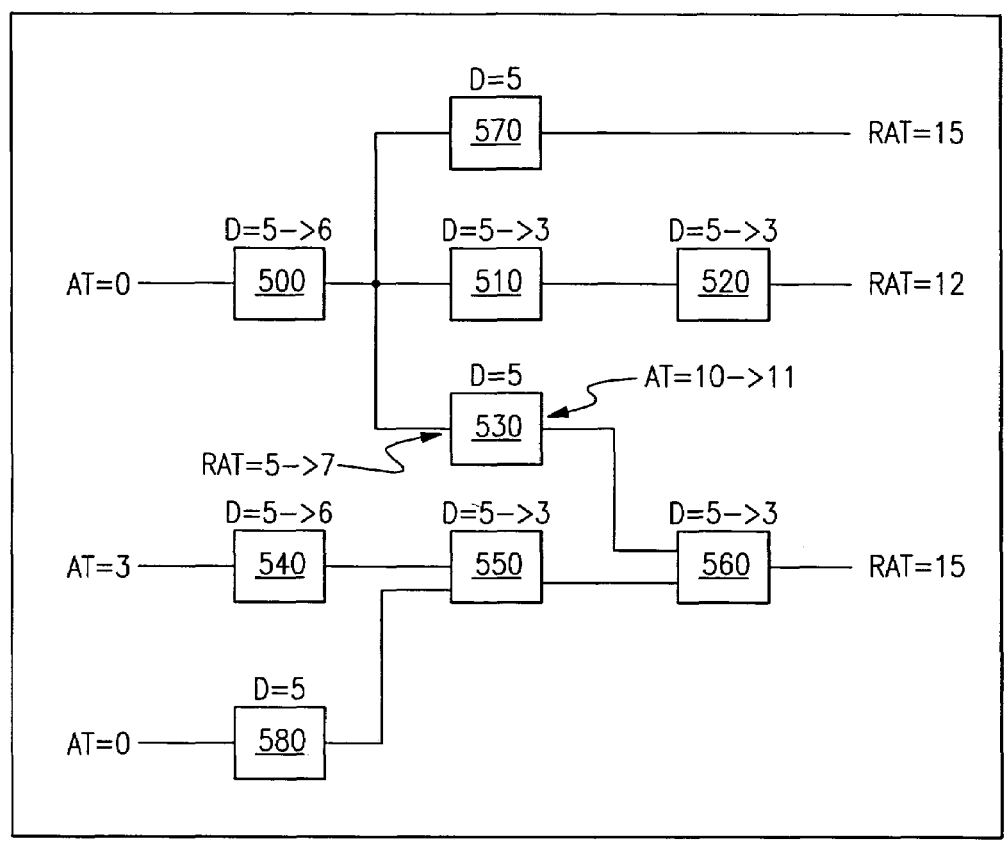
FIG. 6 illustrates the blocked propagation of AT or RAT values through a circuit in which internal AT and RAT assertions have been specified.

The need for the second analyzed portion is illustrated in FIG. 6. In the original circuit all edge delays of all gates are 5 time units, and gates 500, 510, 520, 540, 550, and 560 have negative slacks and are thus timing-critical and are included in the optimized portion. For simplicity no expansion of the first optimized portion will be performed, and the first analyzed portion will be assumed to be identical to the first optimized portion. Thus only these timing-critical gates have delays which may change during optimization. Gate 570 is only in the fanout cone of delay-changed gates, and hence its input RAT will not change during optimization and may be treated as a constant (i.e., its input may be treated by the optimizer like a primary output). Similarly, gate 580 is only in the fanin cone of delay-changed gates, and hence its output AT will not change during optimization and may be treated as a constant (i.e., its output may be treated by the optimizer like a primary input). However, gate 530 is in both the fanin and fanout cones of delay-changed gates. If its ATs and RATs are not updated during optimization, its input RAT of 5 must be treated as a constant during optimization, and its output AT of 10 must be treated as a constant during optimization. Assume now that the optimization attempts to improve the minimum slack of the circuit to zero by changing the delays of each of gates 500 and 540 from 5 to 6 while changing the delays of each of gates 510, 520, 550, and 560 from 5 to 3. With a constant RAT of 5 at the input of gate 530, this change would not be allowed because the AT of 6 would cause a slack of 5−6=−1 at the output of gate 500 and the input of gate 530. However if the AT value of gate 530 is allowed to change during optimization, the proposed change can be seen to improve the worst slack at any primary output to 0. Along the paths 500, 510, 520 and 540, 550, 560 the slack is seen to be +3. Along path 500, 530, 560 the slack is seen to be +1.

Because the delays of the second analyzed portion are considered constant during the optimization, additional pruning methods beyond those described by A. R. Conn et al. may be applied to this portion. Specifically, if more than one delay edge is present between a particular source and sink node of the second analyzed portion, only the one with the maximum delay need be retained. More generally, any subgraph of the second analyzed portion which is bounded by N source nodes through which all paths to any node in the subgraph must pass and M sink nodes through which all paths from the subgraph must pass, may be replaced by an edge from every source node to every sink node, for a total of N times M edges, with the delay of each new edge equal to the maximum delay of any path from that edge's source node to that edge's sink node in the original unpruned timing graph. This results in the elimination from the timing graph of all nodes in the subgraph other than the source and sink nodes, and if the number of delay edges in the original subgraph is greater than N times M, will also result in a reduction in the number of delay edges in the timing graph. At the least, reduction of the graph by "contraction" of any series/parallel combination of edges of constant delay can be performed by well-known prior art methods.

Continuing with the flowchart of FIG. 4, in step 450 an optimization method is applied, restricted so that gate parameter values are changed only in gates in the optimized portions of the circuit or system, delay and edge slew values are recomputed only in the first analyzed portion of the circuit or system, and AT and (if used) RAT values are recomputed only in the first and second analyzed portions of the circuit or system.

Figure 7:
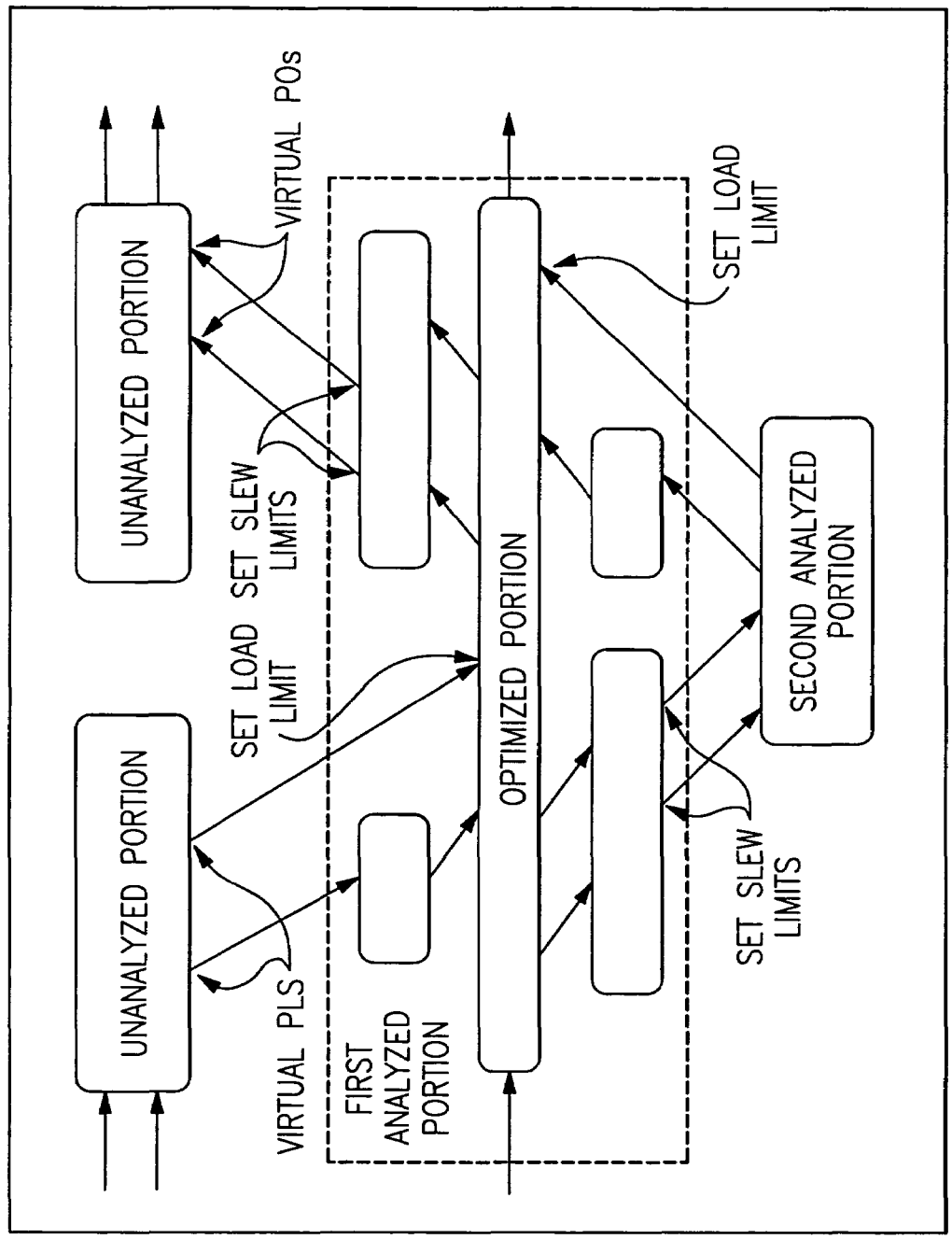
FIG. 7 illustrates the relationships between the analyzed and optimized portions of a circuit or system according to the inventive method.

FIG. 7 illustrates schematically the relationship between the analyzed and optimized portions of a circuit or system, according to the inventive method. The optimized portion may include critical and/or noncritical gates and possibly levels of logic feeding and/or fed by them. The first analyzed portion includes this optimized portion and some additional levels of logic feeding and fed by the optimized portion. The second analyzed portion contains logic which both feeds and is fed by logic in the first analyzed portion. The remaining unanalyzed logic is neither optimized nor analyzed. The points at which this unanalyzed logic feeds the first analyzed portion are treated as virtual PIs, meaning that the are treated in the same manner as primary inputs at which fixed ATs and node slews are asserted. The points at which this unanalyzed logic is fed by the first analyzed portion are treated as virtual POs, meaning that the are treated in the same manner as primary outputs at which fixed RATs and loads are asserted. Slew limits are set at the outputs of the first analyzed portion. Load limits are set at inputs of the optimized portions which are fed directly by gates not in the first analyzed portion.

While the inventive method has been described in its application to late mode timing analysis and optimization, it will be obvious to those skilled in the art that it can equally be applied to early mode timing analysis and optimization. The inventive method can also be applied to other domains in which a portion of a design can be identified which requires modification to meet some design requirements, and the effects of a change at one point in the design may cause propagate effects forward and backward in the circuit. Any forward propagated effect whose influence decreases over successive levels of gates would be treated in a manner similar to slews. Any backward propagated effect whose influence decreases over successive levels of gates would be treated in a manner similar to loads. Any forward propagated effect whose influence does not decrease over successive levels of gates would be treated in a manner similar to edge delays and ATs. Any backward propagated effect whose influence does not decrease over successive levels of gates would be treated in a manner similar to edge delays and RATs.

In particular, the inventive method can be applied to the problem of reducing or limiting the magnitude of noise pulses on gates in a circuit or system. A noise pulse on the input of one gate will propagate forward through other gates fed by it, attenuating as it goes. Thus the propagation of noise pulses behaves in a manner similar to slews. The identification of a first optimized portion of the circuit or system would include an initial noise analysis, using well-known static noise analysis methods, from which gates whose noise output exceeded some threshold would be selected. It would optionally include the selection of additional gates feeding and/or fed by the noise-critical portion. The identification of a first analyzed portion would include all gates of the first optimized portion, augmented by the selection of additional gates feeding and/or fed by the gates of the first optimized portion, in which noise pulse values would be recomputed during optimization. The creation of assertions would include imposing a noise constraint at any node where a gate in the analyzed portion feeds a gate not in the analyzed portion, typically equal to the magnitude of the noise pulse computed in the initial noise analysis.

While the preferred embodiment of the invention has been described, it will be understood that those skilled in the art, both now and in the future, may make various improvements and enhancements which fall within the scope of the claims which follow. These claims should be construed to maintain the proper protection for the invention first described.

What is claimed is:

1. A method of optimizing a digital circuit or system comprising the steps of:
   a) identifying at least one optimized portion of said circuit or system;
   b) identifying at least one analyzed portion of said circuit or system;
   c) performing an optimization of said circuit or system during which changes are made only to gates in said at least one optimized portion, and analysis values are recomputed only for gates in said at least one analyzed portion, and
   wherein said circuit or system is a sequential circuit containing at least one of master slave latches, transparent latches, flip-flops and one or more clocks.

* * * * *